(12) United States Patent
Jain

(10) Patent No.: US 6,704,232 B1
(45) Date of Patent: Mar. 9, 2004

(54) PERFORMANCE FOR ICS WITH MEMORY CELLS

(75) Inventor: Raj Kumar Jain, Mandarin Gardens (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,193

(22) Filed: Sep. 25, 2002

(51) Int. Cl.$^7$ ................................................ G11C 7/00
(52) U.S. Cl. .................... 365/203; 365/189.02
(58) Field of Search ............................. 365/203, 189.02

(56) References Cited

U.S. PATENT DOCUMENTS 6,188,596 B1 * 2/2001 Holst ........................ 365/63
6,215,693 B1 * 4/2001 Chung et al. ............... 365/145

* cited by examiner

*Primary Examiner*—Michael Tran
(74) *Attorney, Agent, or Firm*—Horizon IP Pte Ltd

(57) ABSTRACT

An integrated memory device comprises a multitude of sense amplifiers which output an amplified data signal on a data line. The data line is forced to a precharge potential when idle. A transistor connects the data line to a precharge potential. The memory device avoids the kickback effect during a data read operation.

14 Claims, 5 Drawing Sheets

PERFORMANCE FOR ICS WITH MEMORY CELLS

BACKGROUND OF INVENTION

ICs may include memory cells, such as dynamic random access memory (DRAM) cell for storing information. A plurality of memory cells is interconnected by wordlines and bitlines to form a memory block or array. The bitlines are coupled to sense amplifiers to facilitate memory accesses. Typically, a pair of bitlines (first and second bitlines) is coupled to a sense amplifier. The sense amplifier senses a differential signal on the bitline pair during a read operation and amplifies it. The differential signal is indicative of the data stored in the selected memory cell. After the differential signal is sufficiently amplified, it is gated to a data line which forwards the signal onto the output data path.

A memory array can be divided into a plurality of banks. Each bank is usually provided with at least one data line which is commonly coupled to the sense amplifiers of the bank. When a particular sense amplifier is selected to output its amplified signal onto the data line according to a gating signal supplied from the column decoder, the output of the sense amplifier is connected to the data line.

The data line has a considerable capacitance, which can adversely affect the integrity of the amplified signal. In some cases, the amplified signal can be destroyed by being forced to a level of the read signal from the previous operation cycle. For example, if the amplified signal from the sense amplifier of the current cycle is of the opposite logic level from that of the previous cycle, the signal of the previous cycle may prevent the signal from the current cycle to be driven onto the data lines within the given time. This is generally known as the kickback effect, which leads to read errors.

In order to avoid kickback errors during read operations, the amplified signal from the amplifier needs to be sufficiently strong to drive the data line to the desired level. This requires the sufficient amplification time to ensure that the amplified differential signal can invert the signal on the data line from the previous cycle, thus decreasing performance as well as increasing power consumption.

From the above discussion, it is desirable to increase read performance without incurring higher power consumption in, for example, memory ICs.

SUMMARY OF INVENTION

The invention relates to Improving performance for ICs with memory cells. In one embodiment, improved performance is achieved by providing faster access to the memory array. In one embodiment, a precharge circuit is provided for the data line coupled to the memory array. The precharge circuit, when activated, pulls the potential of the data line to a precharge potential. Preferably, the precharge level is in the middle between the positive and the negative (e.g., ground) supply potentials. The precharging level is preferably the same level as the precharging level that is provided to the bitlines before the sensing operation.

In one embodiment, the precharge circuit comprises a switch for selectively coupling the data line to a supply voltage equal to the precharge voltage level. The precharge circuit, in one embodiment, is controlled by the precharge control signal used to control the precharging of the bitlines.

In one embodiment, after having completed a first read or write operation on a data line, the potential on the data line is forced to the precharge potential. During the next read operation, the data line is brought to a high level or a low level depending on the signal from the sense amplifier. The signal swing is only half of the full signal amplitude between a low level signal and a high level signal. As such, the charging of the data line from the precharge potential to the high level or the low level data signal which may be the positive or the negative power supply potential is achieved faster than a full level swing from a low level signal to a high level signal, or vice-versa.

DETAILED DESCRIPTION

Figure 1:
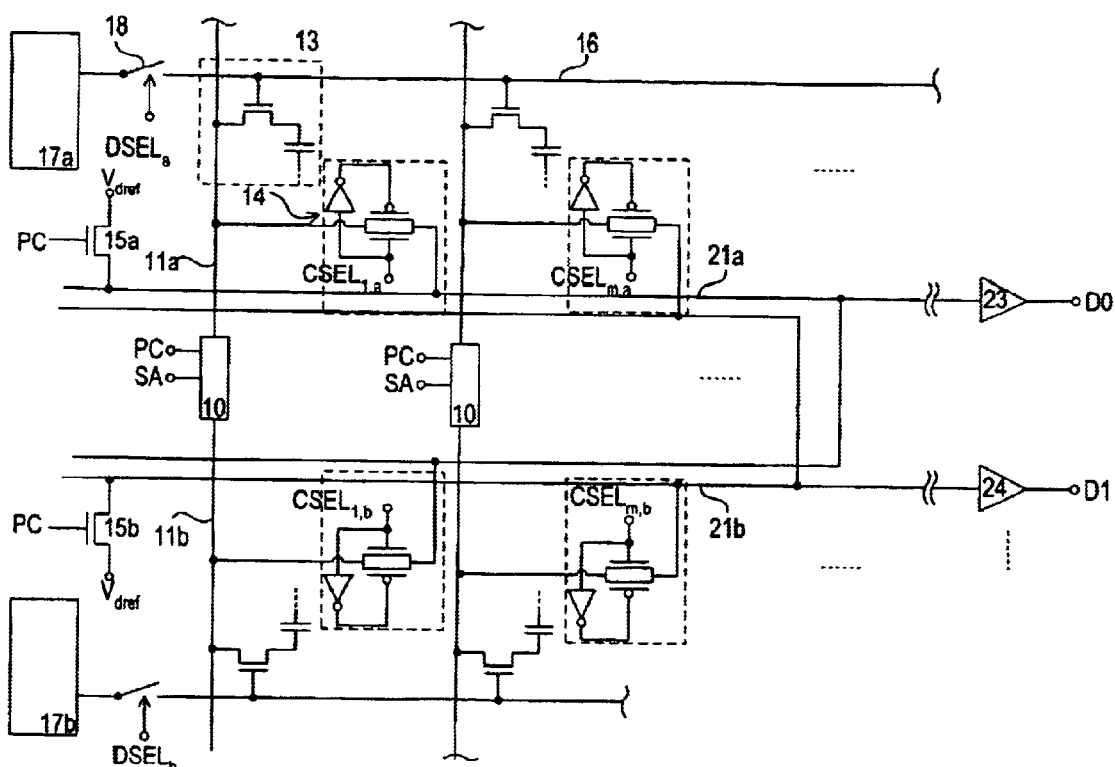
FIG. 1 shows a precharge circuit in accordance with one embodiment of the invention.

FIG. 1 shows a memory array in accordance with one embodiment of the invention. The memory array is part of, for example, an IC such as a memory IC or system on a chip. Other types of ICs are also useful. The memory array comprises a plurality of memory cells 13 interconnected by wordlines 16 and bitlines 11. In one embodiment, the memory cells are dynamic random access memory cells comprising a selection transistor and a storage capacitor. The charge stored within the capacitor is indicative of the information to be stored. Since the charge leaks through parasitic paths in the substrate of the integrated circuit, the charge must be refreshed after a certain retention time interval. Other types of memory cells, such as static or multi-port memory cells, are also useful.

A row decoder 17 is coupled to the wordlines. The row decoder includes, for example, wordline drivers for driving the wordlines to an active level (e.g. logic "1"). The row decoder receives a row address, decodes it, and activates a wordline based the decoded row address (e.g., drives the selected wordline to an active level). In one embodiment, a switch 18 is provided to selectively couple the wordline to the wordline driver for driving the wordline. The switch, for example, comprises a transistor. In one embodiment, the switch is activated in response to an active decoder signal ($DSEL_{a-b}$) signal. Other techniques for selectively activating the appropriate wordline corresponding to a decoded row address are also useful.

A plurality of sense amplifiers 10 is coupled to the bitlines to facilitate memory accesses to memory cells. In one embodiment, a sense amplifier is coupled to a pair of bitlines $11a-b$. As shown, the bitlines are arranged in an open bitline architecture. Other types of architectures, such as the folded bitline architecture, are also useful. In one embodiment, the sense amplifier also includes precharge and write circuitry. The precharge circuitry is activated by a precharge signal (PC) to precharge the bitlines to a reference voltage $V_{ref}$. The reference voltage is, for example, $V_{DD}/2$, where V is the positive supply potential. In another embodiment, $V_{ref}$ is equal to $V_{DD}/2+\Delta V$. The offset $\Delta V$ can be positive or negative, for example, to compensate the body bias effect and/or the voltage drop across the access transistor. Providing other reference voltages, such as $V_{SS}$, is also useful.

The bitlines are multiplexed to the data lines 21a–b. In one embodiment, a column switch 14 selectively couples the bitline to the data line, In response to a column select signal CSEL. For example, an active $CSEL_{m,a}$ selects the bitlines corresponding to the m-th word within a row, in memory block a. The CSEL signal is generated by, for example, the column decoder in response to a valid column In one embodiment, the column switch comprises a transmission gate. Preferably, the switches 14 comprise first and second transistors coupled in parallel. More preferably, the first and second transistors are of the opposite type (e.g., n and p-FET). An inverter is provided to invert the control signal to one of the transistors. In one embodiment, the inverter is coupled to the p-FET. The data line may include a stage of secondary sense amplifiers (not shown) for further amplification. In one embodiment, the memory array includes first and second data lines 21a–b. Providing a memory array with other numbers of data lines is also useful. Output drivers 23 drive the read signal on the data lines to, for example, the output pin of the IC. The output drivers, in one embodiment, are tri-state drivers.

In accordance with one embodiment of the invention, a data line precharge circuit 15a–b is coupled to a data line. The precharge circuit, when activated, charges the data line to a data line reference voltage $V_{dref}$. In one embodiment, the $V_{dref}$ is equal to about $V_{DD}/2$. In another embodiment, $V_{dref}$ is equal to $V_{DD}/2+\Delta V$. The offset $\Delta V$ can be positive or negative, for example, to compensate the body bias effect and/or the voltage drop across the access transistor. Providing other reference voltages, such as $V_{SS}$, is also useful.

In one embodiment, the data line precharge circuit comprises a voltage source which is selectively coupled to the data line via a switch 15. In one embodiment, the switch comprises a transistor. When an active signal is provided to the gate of the transistor, the voltage source $V_{dref}$ is coupled to the data line, driving it to the level of the voltage source.

The data line should be charged to $V_{dref}$ prior to being coupled to the bitline. In one embodiment, the data line precharge circuit is activated by the precharge signal (PC) which is used to activate the precharge circuit for precharging the bitlines. Use of other signals to activate the data line precharge circuit is also useful. Precharging the data line to $V_{dref}$ prior to driving the information from the bitline onto the data line advantageously reduces the potential of read errors due to kickback effect. Furthermore, since kickback effect is reduced, the time needed to amplify the bitline signals to ensure that kickback effect is avoided can be reduced, thus increasing performance by having faster read access time.

Figure 2:
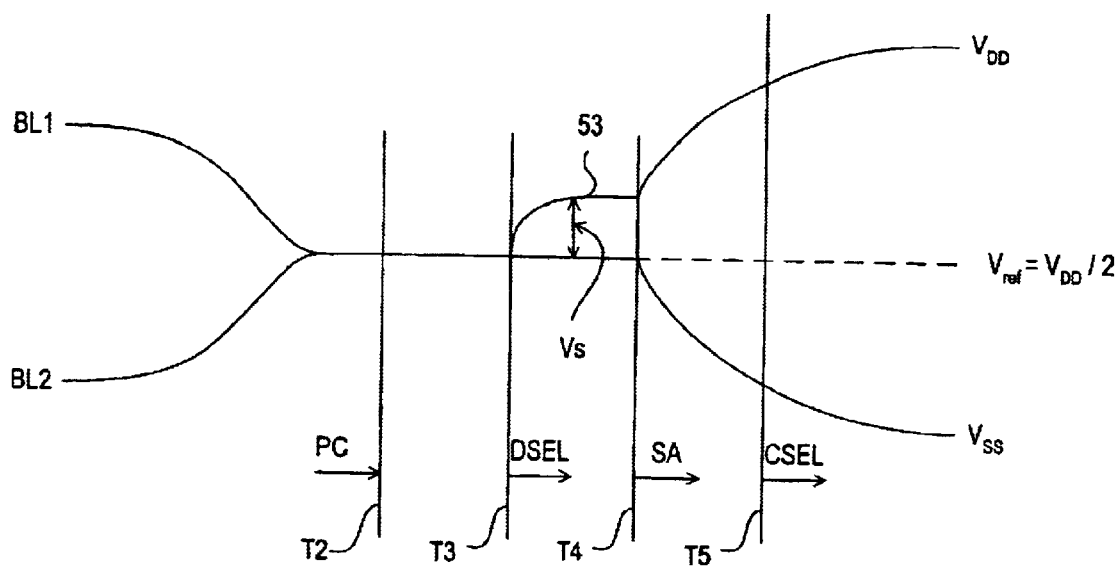
FIG. 2 shows the waveform of the signals on a bitline pair during a read access in accordance with one embodiment of the invention.
Figure 3:
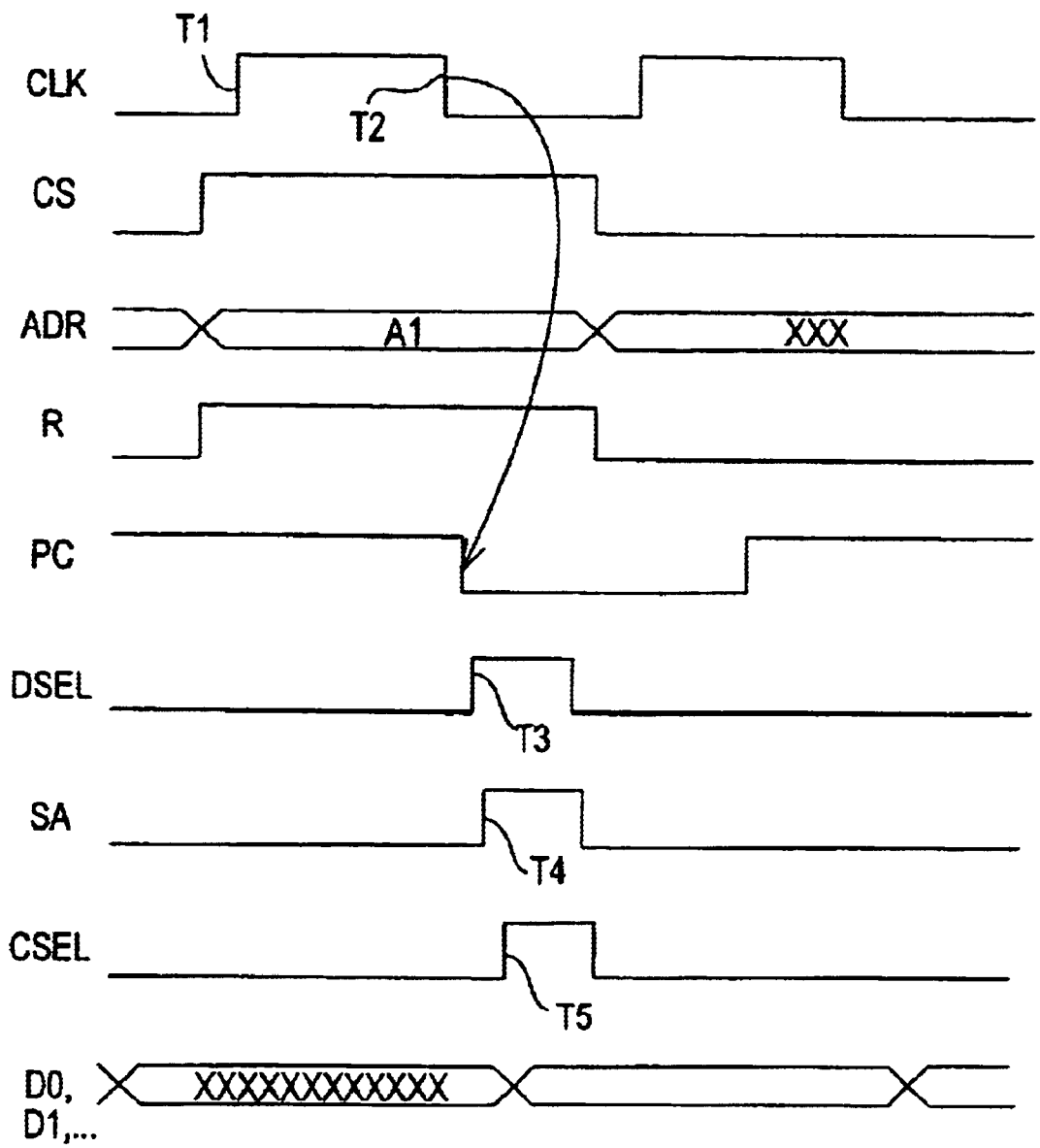
FIG. 3 shows a timing diagram of the precharge circuit In accordance with one embodiment of the invention.

FIGS. 2–3 show bitline signals and timing diagram of a read access in accordance with one embodiment of the invention. Referring to FIG. 2, the bitline signals correspond to a pair of bitlines BL1 and BL2 on which the selected memory cell is located on BL1 and contains a logic 1 stored therein. Timing references In FIG. 2 corresponds to timing references in FIG. 3. Referring to FIGS. 2–3, a clock signal CLK can be provided to synchronize the operation of the memory array. A chip select (CS), address (ADR), and the read request (R) signals are provided to Initiate a read access at $T_1$. The decoder decodes ADR and selects a memory cell in the array.

BL1 and BL2 are equalized to $V_{ref}$ as a result of an active PC signal. In accordance with one embodiment of the invention, the PC signal is also used to precharge the data line. As such, the data line is driven to $V_{dref}$.

At $T_2$, the falling edge of the clock cycle, the PC signal is deactivated.

At $T_3$, an active DSEL signal corresponding to the decoded row address is provided, activating the wordline driver corresponding to the selected wordline. This drives the wordline to an active level (e.g. logic "1"), coupling the selected memory cell to BL1. The charge stored in the capacitor causes a differential signal on the bitline pair. In one embodiment, the differential signal (e.g., 53) is either positive or negative with respect to the reference voltage $V_{DD}/2$, depending whether a 1 or 0 was stored in the selected memory cell. Illustratively, the data in the selected memory cell is a logic 1, causing a positive differential on BL1 with respect to $V_{ref}$ while BL2 is maintained at $V_{ref}$.

At $T_4$, the signals on the bitlines are amplified by the sense amplifier in response to an active SA signal. The potentials on the bitline pair are now driven the full levels.

For example, BL1 is driven to $V_{DD}$ while BL2 is driven to $V_{SS}$ (e.g., ground). The full high level signal level is at supply potential $V_{DD}$ and the full low level signal level is at ground potential $V_{SS}$.

After sufficient amplification, the amplified signal on the bitline connected to the selected memory cell is passed onto the data line by CSEL signal at time $T_5$. Having propagated along the data line and through output driver 23, the data signal originating from selected memory cell is present as output signal D0 at an output pin of the memory device. The number of output signals that can be read out during a cycle depends on the number of data lines. For example, as shown in FIG. 1, two data signals can be read out in parallel from the two data lines.

Figure 4:
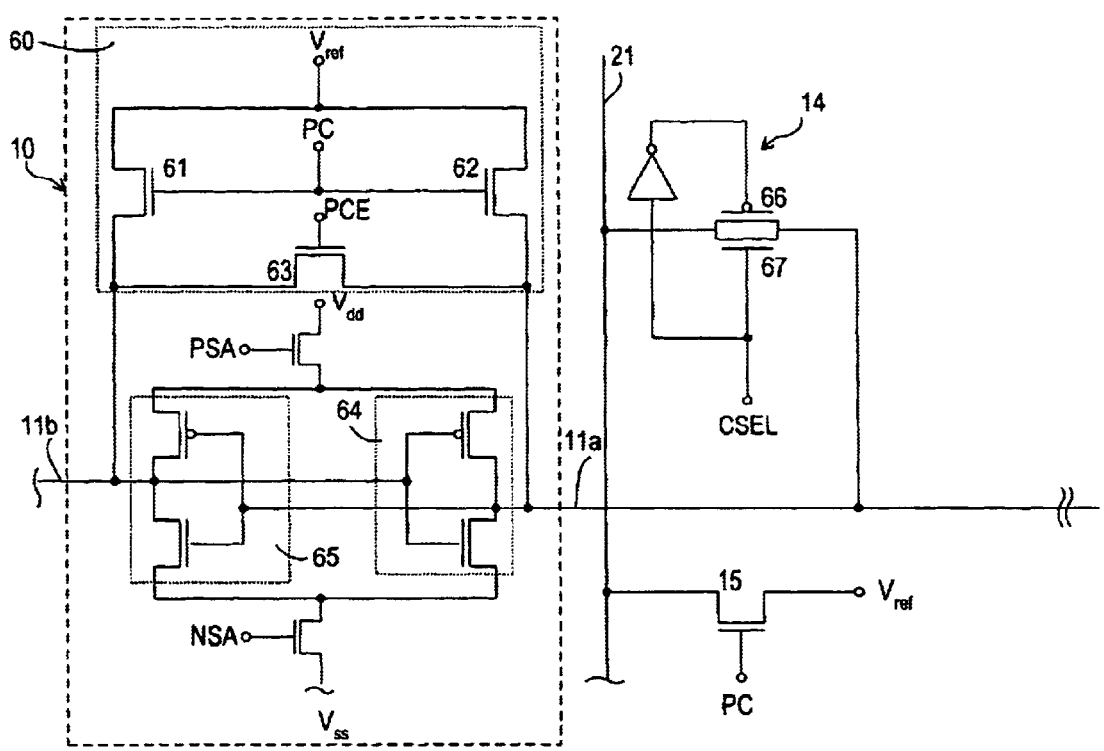
FIG. 4 shows a sense amplifier in accordance with one embodiment of the invention.

FIG. 4 shows a sense amplifier and data line precharge circuit in accordance with one embodiment of the invention. The sense amplifier 10 comprises first and second inverters 64 and 65 which are cross-coupled. The inverters are supplied by supply potentials $V_{DD}$ and $V_{SS}$. The bitlines are driven to the high and low level potentials (e.g. $V_{DD}$ and $V_{SS}$) in response to the control signals PSA and NSA respectively. Providing a boosted voltage supply (e.g., $V_{DD}+\Delta V$) is also useful. The sense amplifier is connected to the first and second bitlines 11a–b. The sense amplifier further comprises a precharge circuit 60, which is connected to the bitlines to supply the precharge potential $V_{REF}$. The precharge control circuit 60 comprises first and second transistors 61 and 62, which connect the precharge potential $V_{REF}$ to the bitlines during an active phase of precharge control signal PC. In one embodiment, an equalization transistor 63 is further provided between the two bitlines. The equalization transistor couples the bitlines in response to, for example, an active precharge equalization (PCE) signal.

When the signals on the bitlines are sufficiently driven to their desired levels, a switch 14 is activated to couple the bitline 11 a to the data line 21. In one embodiment, the switch comprises a transmission gate having complementary MOS-transistors 66 and 67. The transistors are controlled by CSEL. An active CSEL signal activates the transmission gate.

A data line precharge circuit 15 is coupled to the data line 21. The precharge circuit, In one embodiment, comprises a reference voltage source $V_{dref}$ coupled to the data line via an n-FET. The n-FET is controlled, in one embodiment, by precharge control (PC) signal in parallel to bitline precharge circuit 60.

The control signals for the switch 14 and the data line switch 15 are configured to ensure that when one switch is active (conductive), the other is inactive (non-conductive).

Preferably, there is a certain overlap period during which both switches are non-conductive. Preferably, the switch 14 is controlled by the column select signal CSEL and the switch 15 is controlled by the precharge signal PC.

During the precharge phase (e.g., prior to $T_2$), the data line is forced to precharge potential $V_{dref}$. Then, the bitline precharge circuit 60 and the data line switch 15 are switched non-conductive so that sense amplifier 10 can start the sensing in the amplification phase. After sufficient amplification, the switch 14 is activated, coupling the bitline to the data line. Since the potential of data line 21 is in the middle of the two potentials $V_{DD}$ and $V_{SS}$, the potential on data line 21 need only be driven through half of a full signal swing, that is from $V_{DD}/2$ to $V_{DD}$ or $V_{SS}$. Since the data line 21 carries the precharge potential when being connected to the sense amplifier, it is not possible for the potential of the data line 21 to kickback and destroy the potential present on the bitline even though the parasitic capacitance of the data line 21 is considerably larger than the capacitance of bit line 11.

Figure 5:
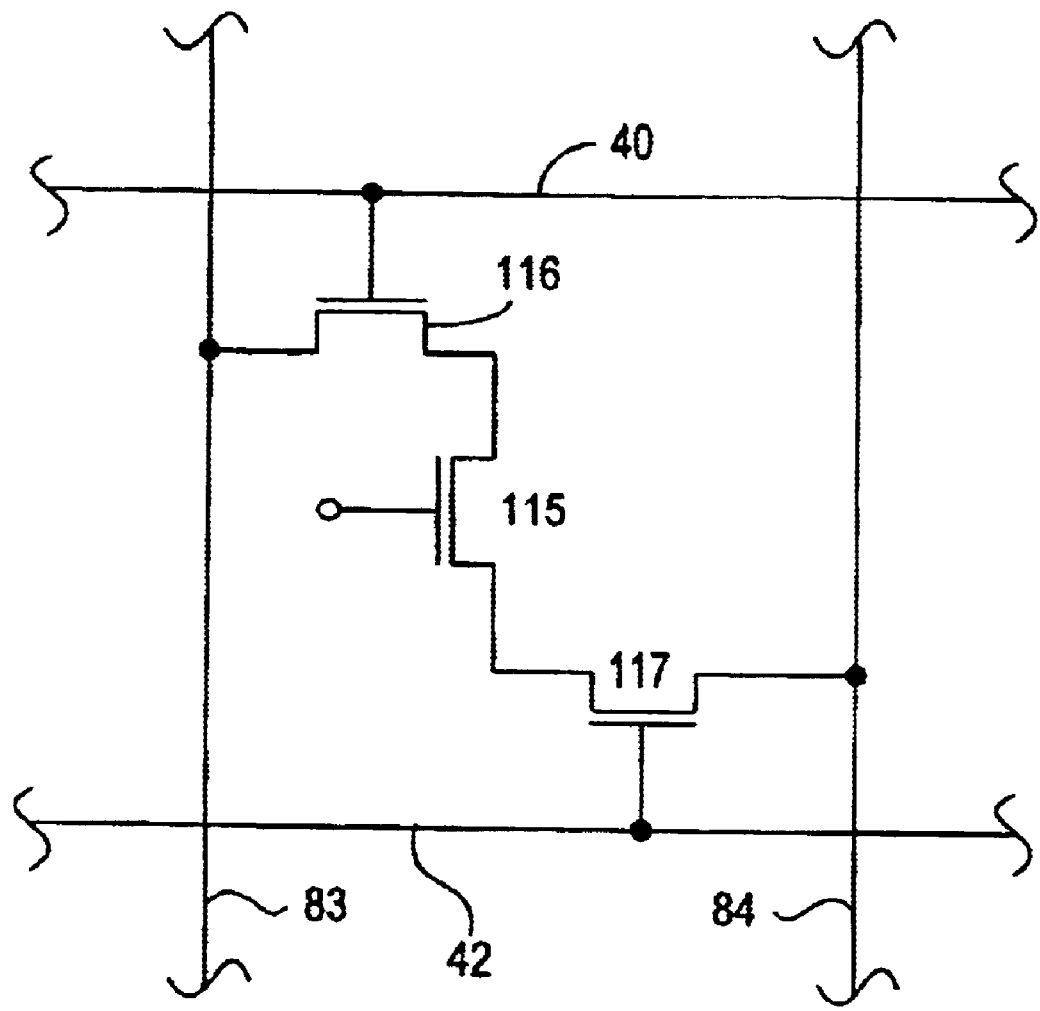
FIG. 5 shows a memory cell in accordance with one embodiment of the invention.

FIG. 5 shows a memory cell in accordance with one embodiment of the invention. A plurality of such memory cells can be interconnected to form a memory array. The memory cell comprises a storage transistor 115. The gate electrode of the storage transistor 115 is connected to a reference potential, e.g. the positive power supply $V_{DD}$. One end of the drain source path of the storage transistor 115 is connected to a selection transistor 116, the gate of which is being connected to word line 40 and another end of its drain source path being connected to bit line 83. The other end of the drain source path of storage transistor 115 is connected to a second selection transistor 117, the gate of which being connected to word line 42 and another end of its drain source path being connected to bit line 84. In one embodiment, the transistors of the memory cell are n-FETs. Providing a memory cell with p-FETs or a combination of n and p-FETs is also useful. The storage transistor 115 can be replaced by a storage capacitor in other embodiments.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

I claim:

1. An integrated memory device, comprising:
   a memory cell array having a plurality of memory cells interconnected by wordlines and bitlines, the bitlines of the memory array are arranged in pairs including a first and a second bitline;
   a plurality of sense amplifiers coupled to the bitlines, wherein a sense amplifier is coupled to a bitline pair;
   a data line, the plurality of sense amplifiers are multiplexed to the data line, the data line transmitting information from a selected cell from one of the plurality of sense amplifiers; and
   a data line precharge circuit coupled to the data line, the data line precharge circuit, when activated, precharges the data line to a data line reference voltage.

2. The integrated memory device of claim 1 wherein the data line reference voltage is about $V_{DD}/2$.

3. The integrated memory device of claim 1 wherein the data line reference voltage is about $V_{DD}/2+\Delta V$.

4. The integrated memory device of claim 1 wherein the data line reference voltage is about $V_{SS}$.

5. The integrated memory device of claim 1 wherein the data line precharge circuit comprises a voltage source, the voltage source being selectively coupled to the data line using a switching element.

6. The integrated memory device of claim 5 wherein the switching element comprises a transistor.

7. The integrated memory device of claim 5 wherein the data line precharge circuit is activated by a precharge signal.

8. An integrated memory device, comprising:
   a plurality of memory cells and a plurality of bitlines, a memory cell being connected to one of said bitlines;
   a plurality of sense amplifiers, a sense amplifier being connected to a first and a second one of said bitlines;
   an output of each one of said sense amplifiers being coupled to a data line through a first switching element; and
   a second switching element coupling said data line to a reference voltage source.

9. The memory device of claim 8, wherein said first switching element is inactive when said second switching element is active, and wherein said first switching element is active when said second switching element is inactive.

10. The memory device of claim 9, wherein said first switching element comprises a transmission gate.

11. The memory device of claim 10 wherein said second switching element comprises a transistor.

12. The memory device of claim 8 wherein the reference voltage source provides a reference voltage of about $V_{DD}/2$.

13. The memory device of claim 8 wherein the reference voltage source provides a reference voltage of about $V_{DD}/2+\Delta V$.

14. The memory device of claim 8 wherein the reference voltage source provides a reference voltage of about $V_{SS}$.

* * * * *